United States Patent
Pangrle et al.

(10) Patent No.: US 6,660,619 B1
(45) Date of Patent: Dec. 9, 2003

(54) DUAL DAMASCENE METAL INTERCONNECT STRUCTURE WITH DIELECTRIC STUDS

(75) Inventors: Suzette K. Pangrle, Cupertino, CA (US); Lynne A. Okada, Sunnyvale, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 10/058,048

(22) Filed: Jan. 29, 2002

Related U.S. Application Data
(60) Provisional application No. 60/265,077, filed on Jan. 31, 2001.

(51) Int. Cl.⁷ .................. H01L 21/3205; H01L 21/4763
(52) U.S. Cl. ...................... 438/586; 438/622; 438/634; 438/644; 438/645
(58) Field of Search .................. 438/586, 622, 438/644, 645, 619, 634, 637, 640

(56) References Cited

U.S. PATENT DOCUMENTS

| | | | | |
|---|---|---|---|---|
| 5,362,666 A | * | 11/1994 | Dennison | 438/396 |
| 5,439,848 A | * | 8/1995 | Hsu et al. | 438/151 |
| 6,090,698 A | * | 7/2000 | Lee | 438/619 |
| 6,136,680 A | * | 10/2000 | Lai et al. | 438/597 |
| 6,258,715 B1 | * | 7/2001 | Yu et al. | 438/648 |
| 6,261,942 B1 | * | 7/2001 | Zhou et al. | 438/619 |
| 6,316,348 B1 | * | 11/2001 | Fu et al. | 438/636 |
| 6,369,430 B1 | * | 4/2002 | Adetutu et al. | 257/382 |
| 6,372,632 B1 | * | 4/2002 | Yu et al. | 438/634 |
| 6,468,894 B1 | * | 10/2002 | Yang et al. | 438/622 |
| 6,524,964 B2 | * | 2/2003 | Yu | 438/736 |
| 6,573,175 B1 | * | 6/2003 | Yin et al. | 438/637 |

* cited by examiner

*Primary Examiner*—Michael S. Lebentritt

(57) ABSTRACT

A method for forming a dual damascene conductive line and conductive plug using porous low k dielectric materials in the via and trench layers. The via layer is provided with dense low k dielectric plugs that increase the mechanical strength of the porous low k dielectric layer that forms the via layer. A via fill technique etches some of the dielectric plugs in the via layer and fills them with conductive material. The via fill technique reduces the damage done to the via holes in the via layer caused by photoresist removal processes.

13 Claims, 4 Drawing Sheets

DUAL DAMASCENE METAL INTERCONNECT STRUCTURE WITH DIELECTRIC STUDS

RELATED APPLICATIONS

This application claims priority from Provisional Application Serial No. 60/265,077 filed on Jan. 31, 2001, the entire disclosure of which is hereby incorporated by reference herein.

FIELD OF THE INVENTION

The present invention relates to the field of semiconductor processing and metal interconnection technology, and more particularly, to formation of a dual damascene metal interconnect structure in low k dielectric layers.

BACKGROUND OF THE INVENTION

The escalating requirements for high density and performance associated with ultra large-scale integration semiconductor wiring require responsive changes in interconnection technology. These escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole while a conductive plug filling a contact hole establishes electrical contact with an active region on a semiconductor substrate, such as a source/drain region. Conductive lines are formed in trenches which typically extend substantially horizontally with respect to the semiconductor substrate. Semiconductor chips comprising five or more levels of metallization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques and filling the opening with conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with conductive material, typically a metal, to simultaneously form a conductive plug and electrical contact with a conductive line.

In efforts to improve the operating performance of a chip, low k dielectric materials have been increasingly investigated for use as replacements for dielectric materials with higher k values. Lowering the overall k value of the dielectric layers employed in the metal interconnect layers lowers the RC of the chip and improves its performance. However, low k materials such as benzocyclobutene (BCB), hydrogen silsesquioxane (HSQ), SiOF, etc., are often more difficult to handle than traditionally employed higher k materials, such as an oxide. For example, low k dielectric materials are readily damaged by techniques used to remove photoresist materials after the patterning of a layer. Hence, a feature formed in a low k dielectric layer may be damaged when the photoresist layer used to form the feature (e.g., trench or via) is removed.

Another problem with low k dielectric materials, especially porous low k dielectric materials, is their relatively low mechanical strength. This can lead to a number of concerns in the final product, since the relatively low mechanical strength of the porous low k dielectric material can exhibit stresses and cracking that reduces the structural integrity of the layer and possibly subsequent layers that are formed over the porous dielectric layer. The low mechanical strength of the porous low k dielectric material is especially noticed in via layers. This is because the metal density in via layers is low in comparison to conductive line layers. Even moderately strong porous low k dielectric materials may not adequately survive the chemical mechanical polishing process during which pressure is applied against the top surface of the wafer. Hence, since the metal density in the via layers is low, CMP pressure applied may cause the porous low dielectric material to mechanically fail.

SUMMARY OF THE INVENTION

There is a need for forming a metal interconnect structure using a dual damascene technique that employs porous low k dielectric materials in the dielectric layers of the structure. At the same time, however, there is a need to improve the mechanical strength of such an arrangement.

These and other needs are met by embodiments of the present invention which provide a method of forming a metal interconnect structure, comprising the steps of forming a first porous low k dielectric layer on a substrate. Dielectric studs are formed in the first porous low k dielectric layer. The dielectric studs comprise a dense low k dielectric material. A second porous low k dielectric layer is formed on the first porous low k dielectric layer. A trench is then etched in the second porous low k dielectric layer and a via in the first porous low k dielectric layer is etched. The via is etched from one of the dielectric studs. The trench is located over the via. Conductive material is simultaneously deposited in the via and the trench to form a conductive plug and line.

The formation of dielectric studs in a porous low k dielectric layer, such as a via layer, improves the mechanical strength of the dual damascene metal interconnect arrangement. This allows porous low k dielectric material to be used in the via and trench layers, with improved mechanical strength in the arrangement. A via fill technique is employed in certain embodiments of the present invention in which the dielectric studs are formed by etching holes in the porous low k dielectric layer and filling these holes with dense low k dielectric material. The use of dense low k dielectric material increases the mechanical strength of the porous low k dielectric layer. When a conductive plug is to be formed, some of the dielectric studs are etched when the trench in the overlying electric layer is etched. One of the advantages of using a via fill technique is that any damage to the via holes in the via layer caused by photoresist removal processes is lessened.

The earlier stated needs are also met by other aspects of the present invention which provide a metal interconnect structure comprising a first porous low k dielectric layer and at least one dielectric plug in the first porous low k dielectric layer. This dielectric plug comprises dense low k dielectric material. A second porous low k dielectric layer is provided on the first porous low k dielectric layer. A conductive line is provided in the second porous low k dielectric layer and a conductive plug in the first porous low k dielectric layer. The conductive line overlies the conductive plug and together forms an interfaceless dual damascene conductive structure.

The foregoing and other features, aspects and advantages of the present invention will become apparent from the following detail description of the present invention when taken in conjunction with the accompanying drawings.

DETAILED DESCRIPTION OF THE INVENTION

The present invention addresses and solves problems related to the relatively low mechanical strength of porous low k dielectric layers in the formation of dual damascene metal interconnect structures. Due to their high porosity, porous low k dielectric layers exhibit low mechanical strength creating concerns regarding their structural integrity. The present invention mitigates these concerns by improving the mechanical strength of the via layer and dual damascene arrangement. The improvements in mechanical strength are provided by the present invention, in certain embodiments, by the use of dielectric plugs located in the porous low k dielectric layer. The dielectric plugs may be made of a dense low k dielectric material so as to improve the strength of the porous low k dielectric layer in which they are located.

Figure 1:
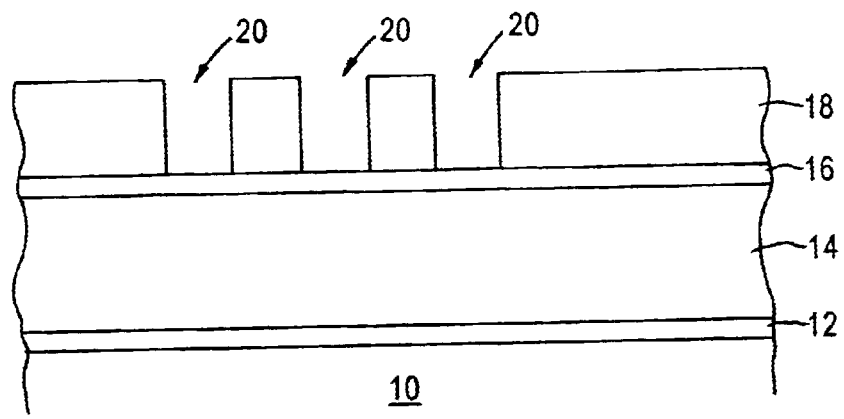
FIG. 1 depicts a schematic cross-section of a portion of the metal interconnect structure during one stage of the metal interconnect structure formation process, in accordance with embodiments of the present invention.

FIG. 1 shows a portion of a metal interconnect region in a semiconductor constructed in accordance with embodiments of the present invention. The substrate 10, which may be another metal layer, for example, is protected by a bottom etch stop layer 12. The bottom etch stop layer 12 may be made of suitable material, such as silicon nitride, for example. Other types of materials may also be used, such as silicon carbide or silicon oxynitride, for example.

A porous low k dielectric material is used to form a first porous low k dielectric layer 14. In the following exemplary embodiment, the porous low k dielectric material is an inorganic material, such as (MSQ), JSR, CCILL as other examples. The term "porous" in this description means that the porosity of the first porous low k dielectric layer 14 is between about 30% to about 70%. The porous low k dielectric material in layer 14 has a suitably low dielectric constant that enables improvements in the operating characteristics of the integrated circuit. However, due to the relatively high porosity, this layer exhibits relatively low mechanical strength.

A top etch stop layer 16 is formed on the first porous low k dielectric layer 14. An example of the material for the top etch stop layer is silicon dioxide ($SiO_2$). A via mask 18 photoresist, for example, is provided on the top etched stop layer of 16. The via mask layer 18 has a plurality of etched openings 20 that define holes that will be transferred to the first porous low k dielectric layer 14 to form via holes therein. The deposition and patterning of the via mask layer 18 is performed by conventional photolithographic techniques.

Figure 2:
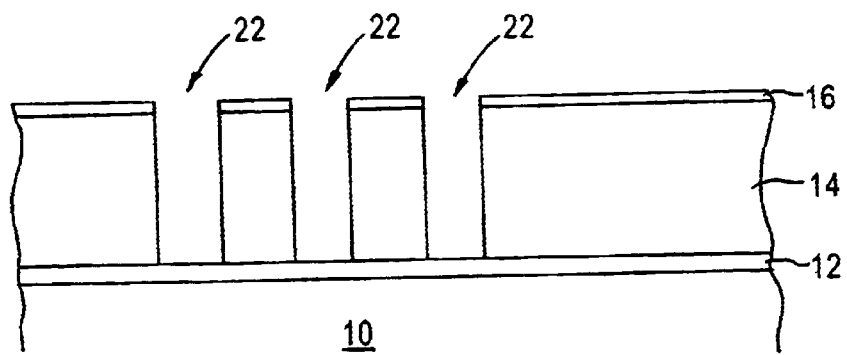
FIG. 2 shows the portion of FIG. 1 after via holes have been etched in the low k dielectric layer and the photoresist has been removed, in accordance with embodiments of the present invention.
Figure 3:
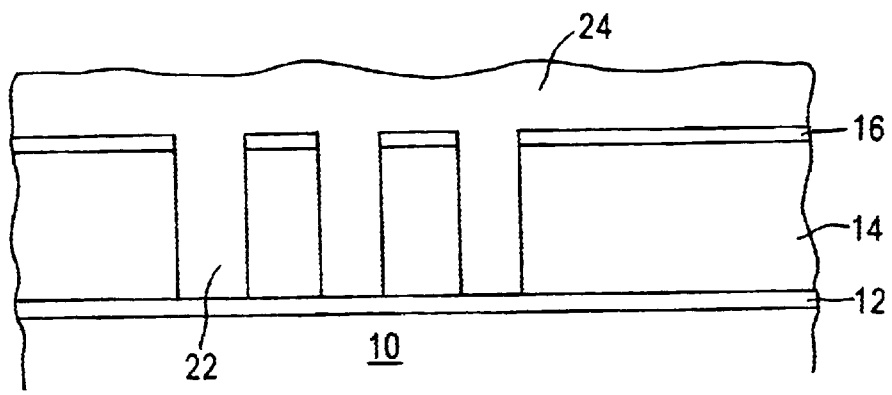
FIG. 3 shows the portion of FIG. 2 after a dense low k dielectric material has been deposited in the via holes and over the low k dielectric layer, in accordance with embodiments of the present invention.

FIG. 2 depicts the metal interconnect portion of FIG. 1 following the etching of the via holes 22 in the low k dielectric layer 14 and through the top etch stop layer 16. Also, the via mask 18 has been removed. Typically, the removal of the photoresist material creates some damage to low k dielectric material. However, the use of the via fill technique, as described below, reduces the number of times the via layer is damaged by photoresist removal processes.

A suitable etchant chemistry for etching the inorganic porous low k dielectric material in layer 14 includes $CHF_3/O_2/Ar$, or $CF_4$, or $C_2F_6$. These etchings are exemplary only, as other suitable etchants may be employed depending on the particular inorganic dielectric material comprising the first porous low k dielectric layer 14. The etchants should be selective such that only the material in the first porous low k dielectric layer 14 is etched with the etching stopping at the bottom etch stop layer 12.

Other suitable inorganic low k dielectric materials include hydrogen silsesquioxane (HSQ), and fluorinated TEOS (FTEOS).

Once the via holes 22 have been etched, dense low k dielectric material is deposited within the via holes 22 and over the first porous low k dielectric layer 14, as well as the top etch stop layer 16. The dense low k dielectric material, in certain preferred embodiments of the invention, is an organic low k dielectric material. Examples include SILK, benzocyclobutene, polyflourotetraethylene, FLARE, etc. The dense low k dielectric material 24 has a porosity of between about 0% to about 20%, in the embodiments of the present invention.

Figure 4:
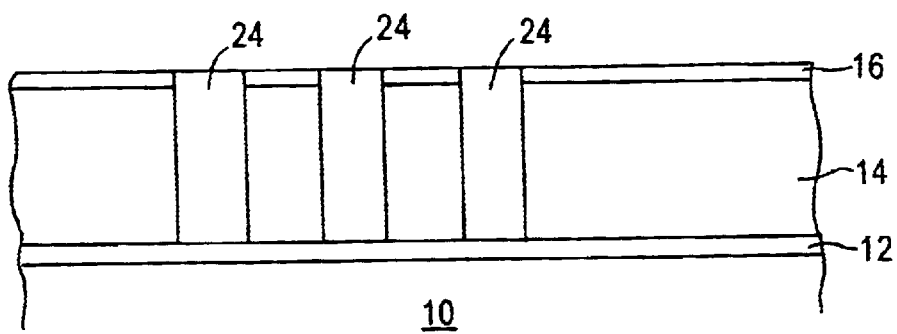
FIG. 4 shows the portion of FIG. 3 after the dense low k dielectric material has been planarized to form dielectric plugs within the via holes in the low k dielectric layer, in accordance with embodiments of the present invention.

A planarization is then performed, the results of which are seen in FIG. 4. The planarization may be performed by etching of the dense low k dielectric material 24, stopping on the top etch stop layer 16. Alternatively, the chemical mechanical polishing may be performed to planarize the structure, again stopping on the top etch stop layer 16, which serves as a polish stop layer in this embodiment.

After the planarization is performed, a plurality of dielectric plugs 24 have been formed in the porous low k dielectric layer 14. Some of these dielectric plugs will remain in the first porous low k dielectric layer 14 to improve the mechanical strength of this layer 14. Other ones of the dielectric plugs 14 will be etched out and filled with conductive material to form conductive plugs.

Figure 5:
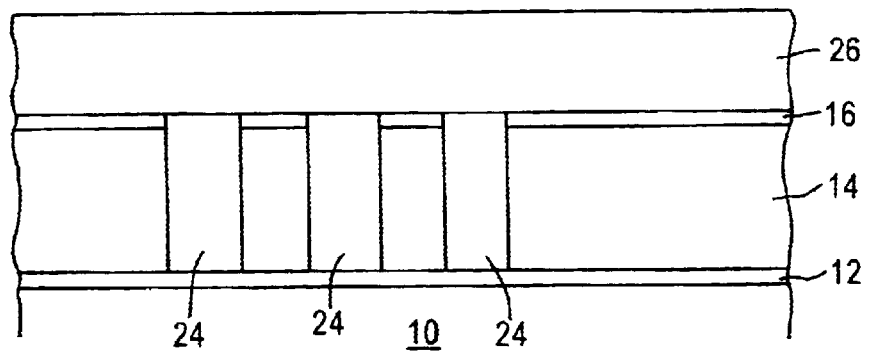
FIG. 5 depicts a portion of FIG. 4 after another layer of porous low k dielectric material is deposited, in accordance with embodiments of the present invention.

In FIG. 5, additional porous low k dielectric material is deposited over the structure of FIG. 4 to form a second porous low k dielectric layer 26. However, like the dense dielectric plugs 24, the second porous low k dielectric layer 26 is formed from organic low k dielectric material. Thus, the first porous low k dielectric layer 14 and the second porous low k dielectric layers 26 have different etch sensitivity to at least one etchant chemistry. At the same time, however, the dielectric plugs 24, also formed from organic low k dielectric material, may have the same etch sensitivities as the second porous low k dielectric layer 26, and may be made of the same dielectric material. The porosity of the second low k dielectric layer 26 is between about 30% to about 70%, in contrast to the dense low k dielectric material and the dielectric plugs 24, which have a porosity of between about 0% to about 20%.

Figure 6:
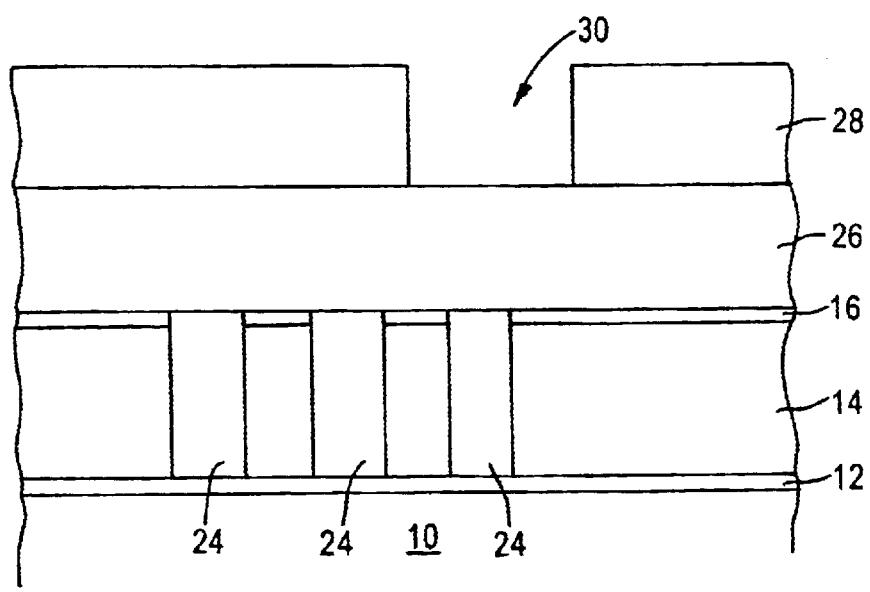
FIG. 6 shows the portion of FIG. 5 after the deposition and patterning of a photoresist layer forming a trench mask layer, in accordance with embodiments of the present invention.

In FIG. 6, a trench mask layer 28 has been deposited and patterned with holes 30 that will be transferred into the second porous low k dielectric layer 26 to form a trench therein. The depositing and patterning of the trench mask layer 28 is accomplished through conventional photolithographic techniques.

Figure 7:
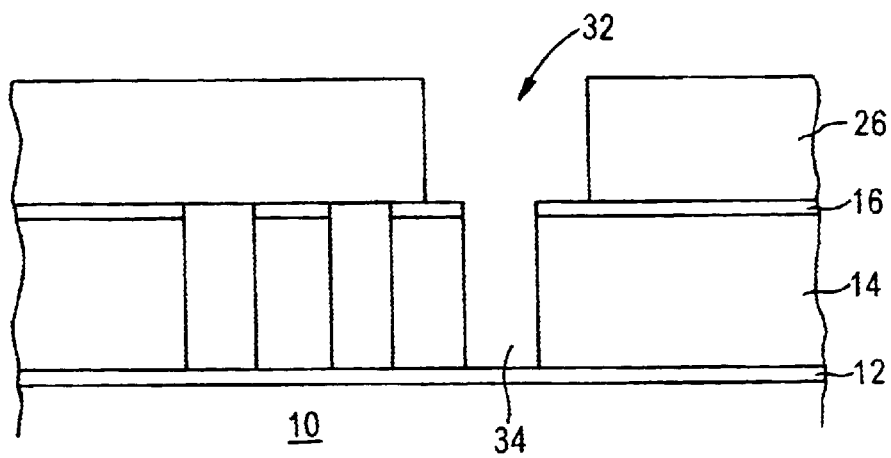
FIG. 7 shows the portion of FIG. 6 after a trench and via have been etched, with the trench mask layer removed, in accordance with embodiments of the present invention.

FIG. 7 shows the portion of FIG. 6 following the etching of a trench 32 and a via 34 in accordance with the opening 30 in the trench mask layer 28. Also, the trench mask layer 28 has been removed. The etching stops at the bottom etch stop layer 12, thereby protecting the underlying substrate 10.

A suitable etchant chemistry may be selected to simultaneously etch the second porous low k dielectric layer 26 and the re-filled via hole 24 (the dense low k dielectric plug 24). Since the materials in the dielectric plug 24 and the second porous low k dielectric layer 26 are both organic low k dielectric materials, the same etchant may be used to form the trench 32 and the via hole 34. A suitable chemistry to etch organic low k dielectric material may be $N_2/H_2$, or $O_2/N_2Ar$, for example.

The dielectric plugs 24 that remain unetched in the first porous low k dielectric layer 14 improve the mechanical strength of this layer. This is especially important in via layers since they contain less metal normally than do conductive line layers.

Figure 8:
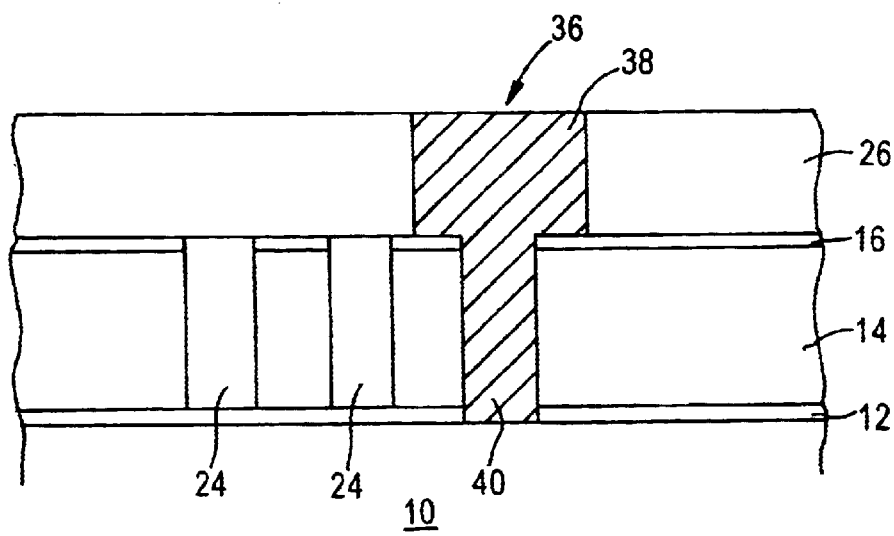
FIG. 8 shows the portion of FIG. 7 after the bottom etch stop layer has been removed from the via and a conductive material has been deposited within the via and the trench, in accordance with embodiments of the present invention.

As seen in FIG. 8, once a trench 32 and a via hole 34 are etched, the bottom etch stop layer 12 is etched, followed by the deposition of a suitable conductive material in the trench 32 and the via hole 34. The deposition of a conductive material 36, such as copper, may be performed simultaneously to produce an interfaceless conductive structure containing conductive line 38 and conductive plug 40. Although not shown, other steps may be involved in the deposition of the conductive material 36. These include the deposition of a barrier metal, such as titanium nitride, and a seed layer prior to the deposition of the copper or other conductive material 36. These steps are not illustrated so as not to obscure the features of the present invention.

Following the deposition of the metal, a planarization is performed, by CMP, for example, to remove excess copper and other conductive material from the surface of the second porous low k dielectric layer 26.

The structure depicted in FIG. 8 is thus a dual damascene structure in which porous low k dielectric materials are employed as the via and trench layers, but with improved strength in the via layer due to the addition of the dense low k dielectric plugs. Further, with a via fill technique, the exposure of the re-filled vias to damaging photoresist removal processes is lessened.

Although the present invention has been described and illustrated in detail, it is to be clearly understood that the same is way of illustration and example only and is not to be taken of way of limitation, the scope of the claims being limited only by the terms of the appended claims.

What is claimed is:

1. A method of forming a metal interconnect structure, comprising the steps of:

forming a first porous low k dielectric layer on a substrate;

forming dielectric studs in the first porous low k dielectric layer, the dielectric studs comprising dense low k dielectric material;

forming a second porous low k dielectric layer on the first porous dielectric layer;

etching a trench in the second porous low k dielectric layer and a via in the first porous low k dielectric layer, wherein the via is etched from one of the dielectric studs and the trench is located over the via; and simultaneously depositing conductive material in the via and the trench to form a conductive plug and line.

2. The method of claim 1, wherein the step of forming dielectric studs in the first porous dielectric layer includes etching the first porous dielectric layer to create via holes and depositing the dense low k dielectric material in the via holes and over the first porous dielectric layer.

3. The method of claim 2, further comprising forming an etch stop layer on the first porous low k dielectric prior to forming the dielectric studs in the first porous low k dielectric layer.

4. The method of claim 2, wherein the conductive material is copper or a copper alloy.

5. The method of claim 2, further comprising removing the dense low k dielectric material over the first porous dielectric layer prior to forming the second porous low k dielectric layer.

6. The method of claim 5, wherein the step of removing the dense low k dielectric material includes chemical mechanical polishing of the dense low k dielectric material on the second porous low k dielectric layer.

7. The method of claim 5, wherein the step of removing the dense low k dielectric material includes etching the dense low k dielectric material.

8. The method of claim 7, wherein the dense low k dielectric material and the first porous low k dielectric layer have different etch sensitivities to at least one etchant chemistry.

9. The method of claim 8, wherein the first porous low k dielectric layer and the second porous low k dielectric layer comprise different porous low k dielectric materials that have different etch sensitivities to at least one etchant chemistry.

10. The method of claim 9, wherein the first porous low k dielectric layer comprises an inorganic porous low k dielectric material and the second porous low k dielectric layer comprises an organic porous low k dielectric material.

11. The method of claim 10, further comprising forming an etch stop layer on the first porous low k dielectric prior to forming the dielectric studs in the first porous low k dielectric layer.

12. The method of claim 11, wherein the conductive material is copper or a copper alloy.

13. The method of claim 12, wherein the porous low k dielectric material in the first porous low k dielectric layer and the porous low k dielectric material in the second porous low k dielectric layer have a porosity between about 30% to about 70%.

* * * * *